(12) United States Patent
Lubomirsky et al.

(10) Patent No.: US 6,869,516 B2
(45) Date of Patent: Mar. 22, 2005

(54) METHOD FOR REMOVING ELECTROLYTE FROM ELECTRICAL CONTACTS AND WAFER TOUCHING AREAS

(75) Inventors: Dmitry Lubomirsky, Cupertino, CA (US); Michael X. Yang, Pala Alto, CA (US); Girish A. Dixit, San Jose, CA (US); Vincent E. Burkhart, San Jose, CA (US); Allen L. D'Ambra, Burlingame, CA (US); Yeuk-Fai Edwin Mok, San Francisco, CA (US); Harald Herchen, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 219 days.

(21) Appl. No.: 10/273,539

(22) Filed: Oct. 18, 2002

(65) Prior Publication Data

US 2004/0074777 A1 Apr. 22, 2004

(51) Int. Cl.$^7$ .............................................. C25D 5/48
(52) U.S. Cl. ......................... 205/220; 134/31; 134/42; 205/799
(58) Field of Search ............................. 205/220, 799; 134/31, 42

(56) References Cited

U.S. PATENT DOCUMENTS

| | | | |
|---|---|---|---|
| 5,238,500 A | 8/1993 | Bergman | 134/3 |
| 5,332,245 A | 7/1994 | King | 280/279 |
| 5,370,741 A | 12/1994 | Bergman | 134/3 |
| 6,019,663 A | 2/2000 | Angell et al. | 451/5 |
| 6,254,469 B1 | 7/2001 | Angell et al. | 451/527 |
| 6,257,958 B1 | 7/2001 | Angell et al. | 451/9 |
| 6,270,647 B1 | 8/2001 | Graham et al. | 205/99 |
| 6,309,981 B1 | 10/2001 | Mayer et al. | 438/754 |
| 6,319,841 B1 | 11/2001 | Bergman et al. | 438/706 |
| 6,333,275 B1 | 12/2001 | Mayer et al. | 438/745 |
| 6,405,101 B1 | 6/2002 | Johanson et al. | 700/218 |
| 6,427,359 B1 | 8/2002 | Scranton et al. | 34/444 |

*Primary Examiner*—Robert R. Koehler
(74) *Attorney, Agent, or Firm*—Moser, Patterson & Sheridan (57) ABSTRACT

A method for cleaning the electrical contact areas or substrate contact areas of an electrochemical plating contact ring is provided. Embodiments of the method include positioning a substrate on a substrate support member having one or more electrical contacts, chemically plating a metal layer on at least a portion of a surface of the substrate, removing the processed substrate from the support member, and cleaning the one or more electrical contacts with a vapor mixture comprising an alcohol. In another aspect, the method includes spraying the vapor mixture on the electrical contacts while rotating the substrate support member.

19 Claims, 3 Drawing Sheets

METHOD FOR REMOVING ELECTROLYTE FROM ELECTRICAL CONTACTS AND WAFER TOUCHING AREAS

BACKGROUND OF THE INVENTION

1. Field of the Invention

Embodiments of the invention generally relate to a method of electrochemical plating. More particularly, embodiments relate to a method for removing electrolyte residue from a contact ring.

2. Description of the Related Art

Electrochemical plating (ECP) has emerged as a promising process for void free filling of sub-quarter micron sized, high aspect ratio interconnect features in integrated circuit manufacturing processes. Conventional ECP systems typically plate metal ions from an electrolyte solution onto a substrate surface using a cathode contact ring to electrically contact the substrate surface. During plating, an electrical bias is simultaneously applied between the substrate-plating surface and a copper anode positioned within the electrolyte solution. The contact ring provides electrical current to the substrate surface to be plated. The application of the electrical bias causes the metal ions to be urged out of the electrolyte solution and plated onto the substrate surface.

One challenge associated with contact-type plating systems is that the electrolyte solution crystallizes or forms a solid film on the electrical contact areas when not in operation. These deposits or electrolyte residue on the contact ring, and particularly on the pins of the contact ring, can change the physical and chemical characteristics of the conductor and eventually deteriorate the contact performance resulting in plating defects. The unwanted deposits are also a source of contamination and can potentially cause damage to the substrate. For example, the deposits may bond/adhere the pins to the substrate during processing. Subsequently, the bond between the pins and the substrate must be broken to remove the substrate from the contact ring. The act of removing the substrate from the pins requires force, which may damage the substrate and may cause particulate contamination.

Efforts to minimize unwanted electrolyte buildup include covering the contact ring and the outer surface of pins with a non-plating or insulation coating. However, while insulation coating materials may prevent plating on the outer pin surface, the upper contact surface remains exposed. Thus, solid deposits are inevitably formed on the pins after extended use. Existing methods of electrolyte removal have also tried spinning a head assembly supporting the contact ring to remove the electrolyte residue using centrifugal force. Efforts also include rinsing the contact ring with water. These methods fall short of their intended purpose in that they only dry and/or dilute the electrolyte residue leaving behind crystals and/or electrolyte films on the electrical contacts and wafer contact areas. Therefore, there remains a need for a method for effectively cleaning electrical contacts and substrate contacting areas of a contact ring for ECP processes.

SUMMARY OF THE INVENTION

Embodiments of the invention generally provide a method for cleaning the electrical contact areas or substrate contact areas of an electrochemical plating contact ring. In one aspect, the method includes positioning a substrate on a substrate support member having one or more electrical contacts, chemically plating a metal layer on at least a portion of a surface of the substrate, removing the processed substrate from the support member, and cleaning the one or more electrical contacts with a vapor mixture comprising alcohol.

In another aspect, the method includes positioning a substrate on a substrate support member having one or more electrical contacts, chemically plating a metal layer on at least a portion of a surface of the substrate, removing the processed substrate from the support member, and cleaning the one or more electrical contacts by spraying a vapor mixture comprising a mixture of isopropyl alcohol (IPA) and nitrogen on the one or more electrical contacts. The vapor mixture includes between about 0.1% by volume and about 20% by volume of the IPA.

In yet another aspect, the method includes positioning a substrate on a substrate support member having one or more electrical contacts, chemically plating a metal layer on at least a portion of a surface of the substrate, removing the processed substrate from the support member, spraying a vapor mixture comprising a mixture of isopropyl alcohol and nitrogen on the one or more electrical contacts, and imparting at least one of rotational, vertical, horizontal, and pivotal movement to the substrate support member while cleaning the one or more electrical contacts.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

A method for removing electrolyte residue from an electrical contact area and substrate contact area of an ECP contact ring is provided. In one embodiment, the method includes spraying a vapor mixture to effectively remove electrolyte residue from the contact ring. The vapor mixture includes one or more alcohols to reduce the electrolyte surface tension, allowing the electrolyte residue to be more easily removed. Suitable alcohols include, for example, polyethylene glycol, glycol ethers, ethylene glycol, propylene glycol, methyl alcohol, ethyl alcohol, propyl alcohol, butyl alcohol, isomers thereof, derivatives thereof, and mixtures thereof. Preferably, the alcohol is isopropyl alcohol, polyethylene glycol, or isomers and derivatives thereof.

In one aspect, the vapor mixture includes a carrier gas, such as nitrogen, argon, helium, or any other non-reactive gas, for example. The carrier gas allows the alcohol to remain substantially in a vapor phase at ambient conditions by reducing the vapor pressure of the mixture. Alternatively, the vapor mixture may include small liquid particles of alcohol, and applied as a mist, depending on the ambient conditions. The carrier gas also helps distribute the alcohol across the contact regions of the contact ring. Further, the carrier gas minimizes the extent to which the alcohol contacts an underlying electrolyte bath.

In one aspect, the vapor mixture includes between about 0.1% by volume (vol %) and about 20 vol % of the alcohol and the remainder is substantially all carrier gas. For example, the vapor mixture may have a composition of 2 vol % IPA and 98 vol % nitrogen gas. The vapor mixture is generally sprayed at a temperature between about 10° C. and about 30° C., such as about room temperature, for a time period between about 1 second and about 30 seconds. As the solution is sprayed onto the contact area, the head assembly may be concurrently rotated at a speed between about 5 rotations per minute (rpm) and about 100 rpm, such as about 20 rpm.

The vapor mixture may be used with any type of wet, chemical plating system. For example, the vapor mixture is useful for cleaning/removing electrolyte from electrical contact areas in an electrochemical plating cell that uses a frontside/production-side contact. The vapor mixture is also useful in an electrochemical plating cell that uses a backside/non-production side contact, as well as a low-volume electroplating cell referred to as a "slim cell", which uses a backside/non-production side substrate contact method.

Figure 1:
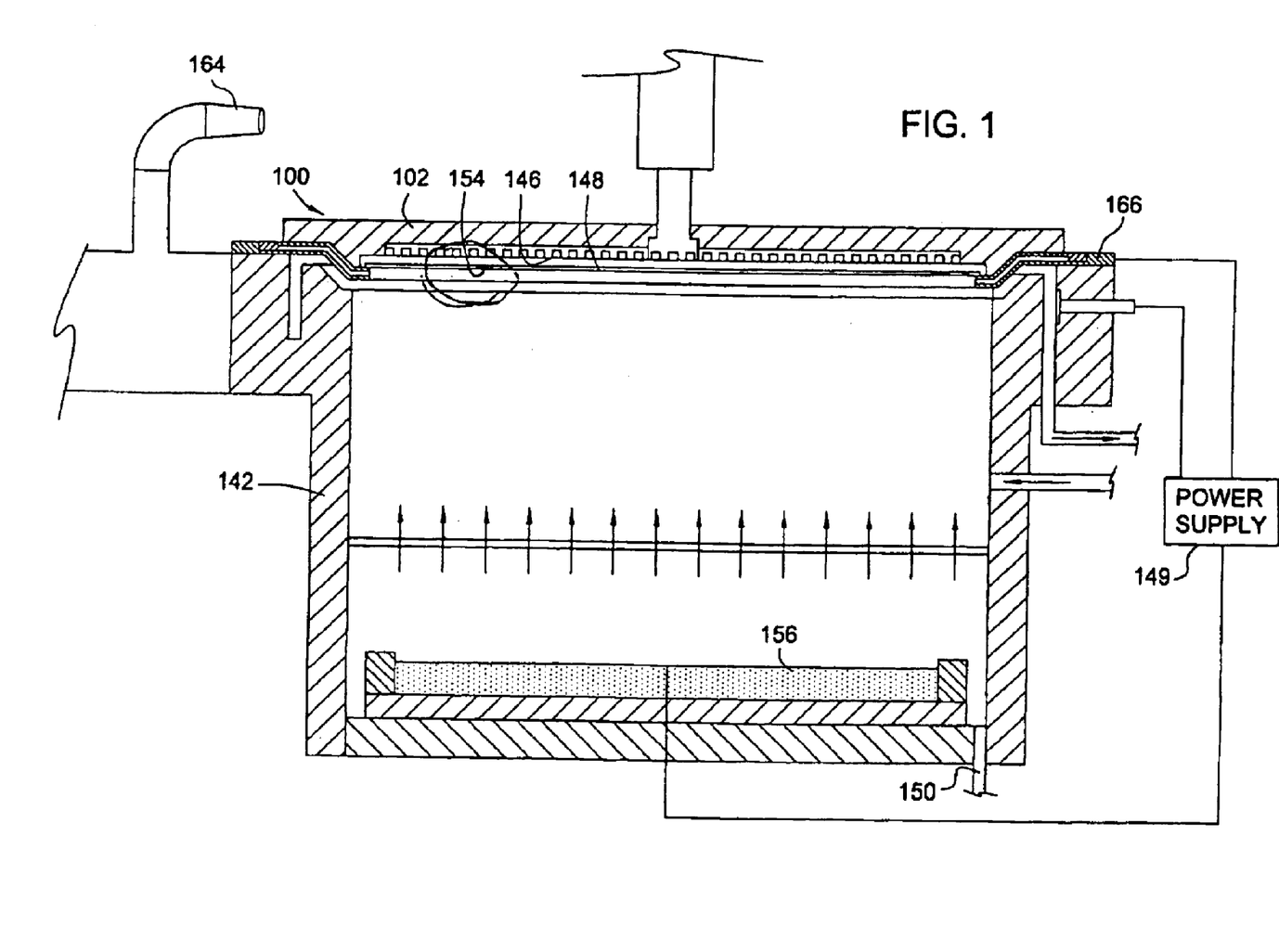
FIG. 1 illustrates a schematic, sectional view of an exemplary electrochemical plating cell.

FIG. 1 is a schematic cross section view of an exemplary, frontside/production side contact type plating cell 100 for depositing a metal onto a substrate surface according to embodiments of the invention described herein. The electroplating cell 100 generally includes a container body 142, a cathodic contact ring 166, an anode 156, a head assembly 102, and one or more spray nozzles 164.

The container body 142, includes an electrolyte solution inlet 150 disposed at a lower portion thereof. The electroplating solution is pumped into the container body 142 by a suitable pump (not shown) connected to the inlet 150. The anode 156 is disposed within the container body 142 and is submerged in the electroplating solution. The anode 156 provides a metal source for the electroplating solution and is connected to a power supply 149. The cathodic contact ring 166 is also disposed within the container body 142 and is in contact with the substrate surface to be plated. The contact ring 166 is also connected to the power supply 149, providing current to the frontside/production side of the substrate 148.

The head assembly 102 serves as a top cover having a substrate supporting surface 146 disposed on the lower portion thereof. A substrate 148 having a plating surface 154 is shown in parallel abutment to the substrate supporting surface 146. The substrate 148 is secured to the substrate supporting surface 146 therethrough.

In between substrate processing, the electrical contact and substrate touching areas may be sprayed with a vapor mixture to remove or prevent any electrolyte residue buildup. The head assembly 102 may be raised to a height in which the electrical contact areas are in-line with the vapor mixture outlets of the spray nozzles 164. Typically, the vapor mixture outlets of the spray nozzles 164 are positioned between about 0.5 inches and about 30 inches above the container body 142. In one aspect, several spray nozzles 164 may be arranged peripherally around the container body 142. For example, three spray nozzles may be disposed every 120° around the container body. In another aspect, the spray nozzles may protrude vertically from the outer edge of the container body and angle inward at a 90° angle so that the spray nozzle outlets are horizontal. The spray nozzles 164 may also be remotely located to avoid over-spray, if any, from contaminating the electrolyte solution within the container body 142. Optionally, the head assembly 102 is rotated while the contact areas are sprayed with the vapor mixture. Accordingly, only one nozzle 164 is needed to evenly distribute the vapor mixture across the contact areas of the contact ring 166.

Figure 2:
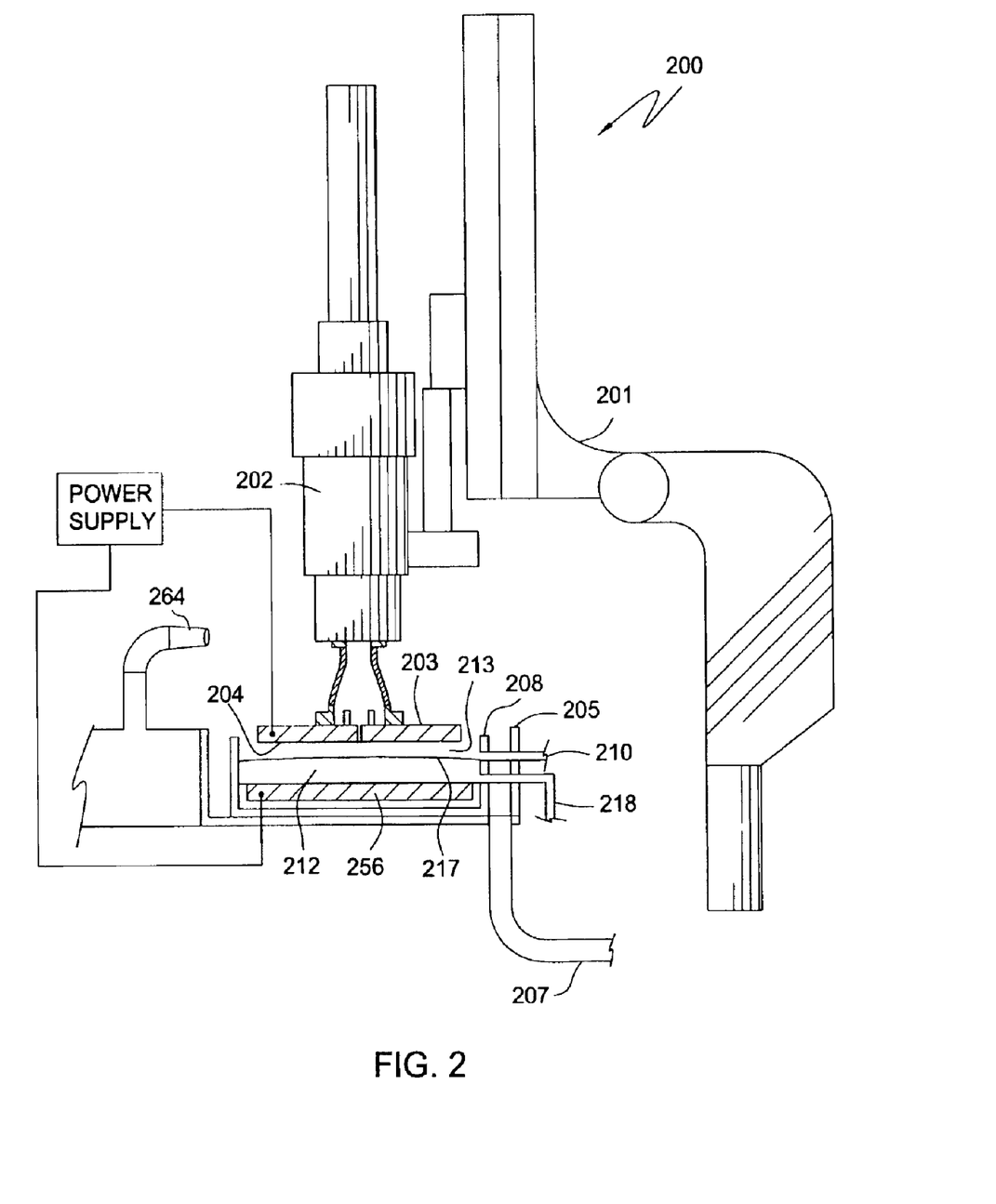
FIG. 2 illustrates a schematic, partial sectional view of another exemplary electrochemical plating cell.

FIG. 2 illustrates a sectional view of another embodiment of a plating cell that may be used to implement aspects of the invention. The plating cell illustrated in FIG. 2 is configured as a backside/non-production side contact-type, electrochemical plating cell 200 having one or more spray nozzles 264. Plating cell 200 generally includes a support arm assembly 201 configured to support a head assembly 202. Arm assembly 201 generally supports head assembly 202 at a position above a plating bath in a manner that allows the head assembly 202 to position a substrate in a plating bath for processing. The head assembly 202 is generally attached to a substrate support member 203 at a lower portion thereof and is configured to provide vertical and rotational movement thereto. The substrate support member 203 is generally configured to support a substrate on a lower surface 204 thereof. The lower surface 204 is defined as the surface of the substrate support member positioned adjacent the plating bath. The lower surface 204 is configured to electrically contact the substrate to facilitate plating thereon. In this configuration, the substrate being plated is generally contacted on the backside or non-production side of the substrate, and therefore, the electrical current supplied thereto is conducted around the bevel edge of the substrate to the plating surface by a conductive layer on the substrate.

The plating bath of the plating cell 200 is generally contained within an inner basin 208, which is separated into two distinct regions, an anode region 212 and a cathode region 213. The inner basin 208 generally resides within a larger diameter outer basin 205, which operates to collect and drain fluids received from the inner basin 208 via fluid drain 207. An anode assembly 256, which may be a consumable or non-consumable-type anode, for example, is generally positioned within the inner basin 208 and is generally configured to provide metal ions to the plating solution for the plating process. The upper portion of the inner basin 208, i.e., the cathode region 213, includes an electrolyte solution fluid inlet 210 configured to supply a plating electrolyte solution to the cathode region 213. A multilevel diffusion differentiated permeable membrane 217 is positioned across the diameter of inner basin 208 at a position below the electrolyte solution fluid inlet 210. As such, the membrane 217 operates to separate the cathode region 213 from the anode region 212, which is generally defined as the volume within inner basin 208 positioned proximate anode 256 below membrane 217.

The anode region 212 includes an additional fluid solution inlet 218 that extends through the sidewall of inner basin 208. The additional fluid inlet 218 may generally operate to supply a fluid solution exclusively to the anode region 212. The fluid provided to the anode region 212 generally must travel through the membrane 217 in order to get to the cathode region 213. A pressure differential is generally generated across the membrane 217, wherein the pressure differential is configured to cause fluid flow through the membrane 217 in a direction from the anode towards the cathode, while preventing reverse flow through the membrane 217.

In between substrate processing, the electrical contact and substrate touching areas may be sprayed with a vapor mixture to remove or prevent any electrolyte residue buildup as previously described with reference to FIG. 1. The head assembly 202 may be raised to a height in which the electrical contact areas are in-line with the vapor mixture outlets of the spray nozzles 264. The spray nozzles 264 may be positioned as described above with reference to the nozzles 164 shown in FIG. 1.

Figure 3:
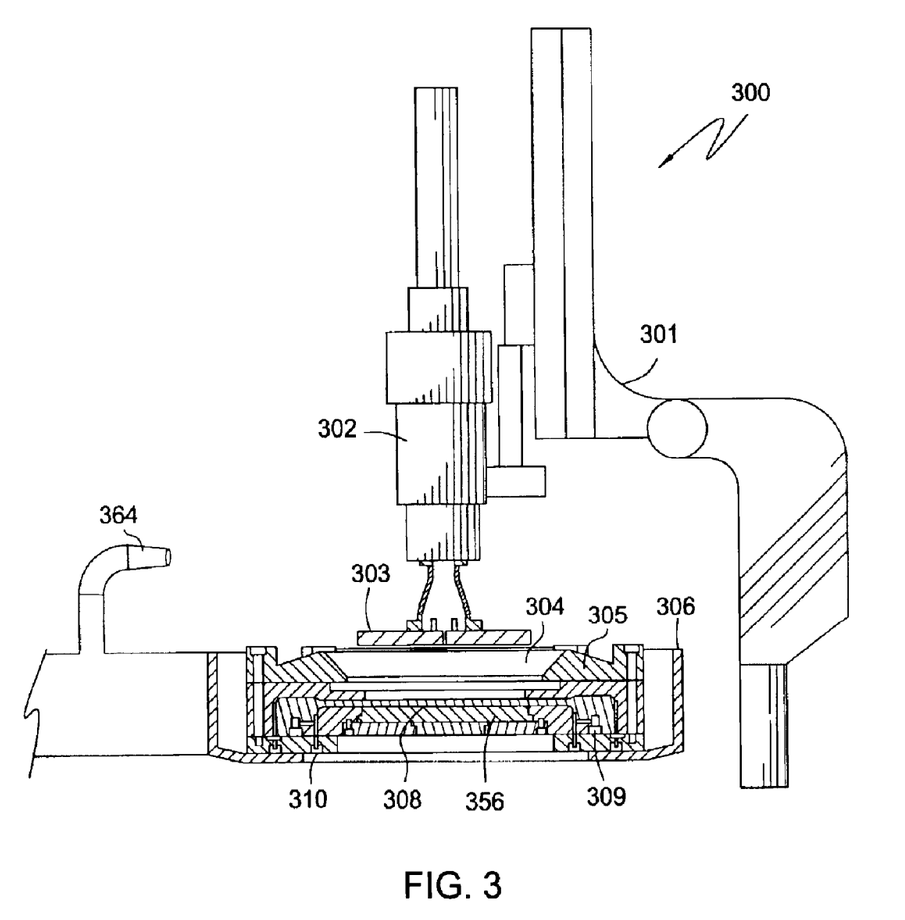
FIG. 3 illustrates a schematic, partial sectional view of yet another exemplary electrochemical plating cell.

FIG. 3 illustrates another embodiment of an exemplary electrochemical plating cell 300 configured to electrically contact the backside/non-production side surface of a substrate being plated according to yet another aspect of the invention. The cell assembly 300 generally includes a support arm 301 configured to support a head assembly 302 at a position above a plating bath 304 in a manner that allows the head assembly 302 to position a substrate in a plating bath for processing. Plating bath 304 is generally configured as a low-volume plating bath. More particularly, the volume of electrolyte solution contained within inner basin 305, i.e., the volume of electrolyte solution within basin 305 used for plating operations, is generally less than about one liter for a basin having a diameter of about 300 mm, which is substantially smaller than conventional cells that generally hold about 6 liters. Therefore, given the diameter of inner basin 305 of about 300 mm, the depth of the electrolyte solution within inner basin 305 having about 1 liter of electrolyte solution therein will generally be less than about one inch. More particularly, the depth of the electrolyte solution within inner basin 305 may be between about 1 mm and about 10 mm, for example. As such, when head assembly 302 operates to position a substrate for plating operations within the electrolyte solution contained by inner basin 305, the surface of the substrate being plated will generally be positioned between about 1 mm and about 10 mm away from the upper surface of diffusion plate 308. The low-volume plating bath 304 provides several advantages, namely, reduced electrolyte solution required for plating. Additionally, the low-volume, which requires low clearance between the substrate being plated and the diffusion plate 308, operates to eliminate head recalibration processes when an anode is replaced or changed out.

The head assembly 302 is generally attached to a substrate support member 303 at a lower portion thereof, and is configured to provide vertical, rotational, and angular movement thereto. The lower surface of the substrate support member is configured to electrically contact the backside of the substrate supported thereon to facilitate electrochemical plating on the production surface of the substrate, and therefore, the electrical current supplied to the substrate is generally conducted around the bevel edge of the substrate to the plating/production surface by a conductive layer deposited on the front side, the bevel edge, and a portion of the backside of the substrate.

The plating bath 304 is generally contained within an inner basin 305, which is separated into two distinct regions, an anode region and a cathode region. The inner basin 305 generally resides within a larger diameter outer basin 306, which operates to collect and drain fluids received from the inner basin 305 via a fluid drain. An anode assembly 356, which may be a consumable or non-consumable-type anode, for example, is generally positioned within a lower portion (anode region) of the inner basin 305. The diffusion plate 308 is generally positioned across the diameter of inner basin at a position above the anode assembly 356, and as such, diffusion plate 308 generally operates to separate the cathode region from the anode region. The upper portion of the inner basin 305 (the cathode region) generally includes an electrolyte solution fluid inlet 309 configured to supply a plating electrolyte solution to the cathode region, while a separate fluid inlet 310 generally operates to supply a fluid solution exclusively to the anode region.

The plating cell 300 also includes one or more spray nozzles 364 disposed thereon. The spray nozzles 364 may be positioned about the plating cell 300 as described above with reference to the nozzles 164 shown in FIG. 1. During substrate processing, the electrical contact and substrate touching areas are sprayed with a vapor mixture to remove or prevent any electrolyte residue buildup as previously described with reference to FIG. 1. The head assembly 302 is typically raised to a height in which the electrical contact areas are in-line with the vapor mixture outlets of the spray nozzles 364.

To further illustrate embodiments of the invention, an ECP process as performed within a frontside/production side contact plating cell will now be described. A substrate 148 having one or more structures formed thereon is first disposed in the plating cell 100 and the plating cell 100 is then sealed. Next, the power supply 149 is activated to provide an electrical current or bias to the anode 156 and to the contact ring 166. The bias typically ranges from about −15 volts to about 15 volts. In one aspect, the positive bias ranges from about 0.1 volts to about 10 volts and the negative bias ranges from about −0.1 to about −10 volts. Once a desired thickness of the metal layer is achieved, the power supply 149 is de-energized. The plating cell 100 is then opened and the plated substrate 148 is removed.

The electrolyte removal process is then administered to remove electrolyte residue from the contact ring 166. To remove the electrolyte from the contact areas of the contact ring 166, the head assembly 102 is raised above the container body 142 to a height in which the areas of contact ring 166 to be cleaned are in-line with the vapor mixture outlets of the spray nozzles 164. The head assembly 102 is then rotated at a constant speed, such as about 20 rpm, while the vapor mixture is sprayed onto the contact ring 166. Once the electrolyte residue has been sufficiently removed, the head assembly 102 is lowered to a processing position so that substrate processing may be resumed.

Alternatively, the electrolyte removal process may be administered after processing a pre-determined number of substrates such as about 20 wafers, for example. Similarly, the electrolyte removal process may be administered when the current distribution from the electrical contact areas to the substrate surface is no longer uniform. This approach provides numerous substrates to be processed between electrolyte removal steps, which increases overall processing throughput.

While the foregoing is directed to embodiments of the present invention, other and further embodiments of the invention may be devised without departing from the basic scope thereof, and the scope thereof is determined by the claims that follow.

What is claimed is:

1. A method for electrochemical plating, comprising:
   positioning a substrate on a substrate support member having one or more electrical contacts;
   chemically plating a metal layer on at least a portion of a surface of the substrate;
   removing the processed substrate from the support member; and
   cleaning the one or more electrical contacts with a vapor mixture comprising alcohol.

2. The method of claim 1, wherein the alcohol is isopropyl alcohol.

3. The method of claim 1, wherein the vapor mixture comprises a mixture of alcohol and nitrogen gas.

4. The method of claim 1, wherein the vapor mixture comprises a mixture of isopropyl alcohol at a concentration between about 0.1% and about 20% by volume.

5. The method of claim 1, wherein the one or more electrical contacts engage a non-production side of the substrate.

6. The method of claim 1, wherein the one or more electrical contacts engage a production side of the substrate.

7. The method of claim 1, further comprising imparting at least one of rotational, vertical, horizontal, and pivotal movement to the substrate support member while cleaning the one or more electrical contacts.

8. The method of claim 1, wherein cleaning the electrical contacts comprises spraying the vapor mixture on the electrical contacts for a time period between about 1 second and about 30 seconds at a temperature between about 10° C. and about 30° C.

9. The method of claim 7, wherein the substrate member is rotated at about 5 rotations per minute to about 100 rotations per minute.

10. The method of claim 1, wherein the vapor mixture is sprayed at a temperature of about room temperature.

11. A method for electrochemical plating, comprising:
   positioning a substrate on a substrate support member having one or more electrical contacts;
   chemically plating a metal layer on at least a portion of a surface of the substrate;
   removing the processed substrate from the support member; and
   cleaning the one or more electrical contacts by spraying a vapor mixture comprising a mixture of isopropyl alcohol and nitrogen gas having an alcohol concentration between about 0.1% by volume and about 20% by volume on the one or more electrical contacts.

12. The method of claim 11, wherein the one or more electrical contacts engage a non-production side of the substrate.

13. The method of claim 11, wherein the one or more electrical contacts engage a production side of the substrate.

14. The method of claim 11, further comprising imparting at least one of rotational, vertical, horizontal, and pivotal movement to the substrate support member while cleaning the one or more electrical contacts.

15. The method of claim 11, wherein the vapor mixture is sprayed at about room temperature for a time period between about 1 second and about 30 seconds.

16. The method of claim 14, wherein the substrate member is rotated at about 5 rotations per minute to about 100 rotations per minute.

17. A method for electrochemical plating, comprising:
   positioning a substrate on a substrate support member having one or more electrical contacts;
   chemically plating a metal layer on at least a portion of a surface of the substrate;
   removing the processed substrate from the support member;
   spraying a vapor mixture comprising a mixture of isopropyl alcohol and nitrogen gas having an alcohol concentration of between about 0.1% by volume and about 20% by volume on the one or more electrical contacts; and
   imparting at least one of rotational, vertical, horizontal, and pivotal movement to the substrate support member while cleaning the one or more electrical contacts.

18. The method of claim 17, wherein the one or more electrical contacts engage a non-production side of the substrate.

19. The method of claim 17, wherein the one or more electrical contacts engage a production side of the substrate.

* * * * *

UNITED STATES PATENT AND TRADEMARK OFFICE
CERTIFICATE OF CORRECTION

PATENT NO.         : 6,869,516 B2                                    Page 1 of 2
APPLICATION NO. : 10/273539
DATED              : March 22, 2005
INVENTOR(S)       : Dmitry Lubomirsky et al.

It is certified that error appears in the above-identified patent and that said Letters Patent is hereby corrected as shown below:

In the drawings:

Replace:

Annotated sheet showing changes in Fig. 1 with replacement sheet of Fig. 1.

Signed and Sealed this

Tenth Day of October, 2006

JON W. DUDAS
*Director of the United States Patent and Trademark Office*

FIG. 1

UNITED STATES PATENT AND TRADEMARK OFFICE
CERTIFICATE OF CORRECTION

PATENT NO.       : 6,869,516 B2
APPLICATION NO.  : 10/273539
DATED            : March 22, 2005
INVENTOR(S)      : Dmitry Lubomirsky et al.

It is certified that error appears in the above-identified patent and that said Letters Patent is hereby corrected as shown below:

Delete the title page and substitute therefor the attached title page.

<u>In the drawings</u>:

Replace:

Annotated sheet showing changes in Fig. 1 with replacement sheet of Fig. 1.

This certificate supersedes Certificate of Correction issued October 10, 2006.

Signed and Sealed this

Thirty-first Day of July, 2007

JON W. DUDAS
*Director of the United States Patent and Trademark Office*

(12) United States Patent
Lubomirsky et al.

(10) Patent No.: US 6,869,516 B2
(45) Date of Patent: Mar. 22, 2005

(54) METHOD FOR REMOVING ELECTROLYTE FROM ELECTRICAL CONTACTS AND WAFER TOUCHING AREAS (75) Inventors: Dmitry Lubomirsky, Cupertino, CA (US); Michael X. Yang, Palo Alto, CA (US); Girish A. Dixit, San Jose, CA (US); Vincent E. Burkhart, San Jose, CA (US); Allen L. D'Ambra, Burlingame, CA (US); Yeuk-Fai Edwin Mok, San Francisco, CA (US); Harald Herchen, Los Altos, CA (US)

(73) Assignee: Applied Materials, Inc., Santa Clara, CA (US)

(*) Notice: Subject to any disclaimer, the term of this patent is extended or adjusted under 35 U.S.C. 154(b) by 219 days.

(21) Appl. No.: 10/273,539

(22) Filed: Oct. 18, 2002

(65) Prior Publication Data
US 2004/0074777 A1 Apr. 22, 2004

(51) Int. Cl.[7] .................................. C25D 5/48
(52) U.S. Cl. ..................... 205/220; 134/31; 134/42; 205/799
(58) Field of Search .................... 205/220, 799; 134/31, 42

(56) References Cited

U.S. PATENT DOCUMENTS

| | | | |
|---|---|---|---|
| 5,238,500 A | 8/1993 | Bergman | 134/3 |
| 5,332,245 A | 7/1994 | King | 280/279 |
| 5,370,741 A | 12/1994 | Bergman | 134/3 |
| 6,019,663 A | 2/2000 | Angell et al. | 451/5 |
| 6,254,469 B1 | 7/2001 | Angell et al. | 451/527 |
| 6,257,958 B1 | 7/2001 | Angell et al. | 451/9 |
| 6,270,647 B1 | 8/2001 | Graham et al. | 205/99 |
| 6,309,981 B1 | 10/2001 | Mayer et al. | 438/754 |
| 6,319,841 B1 | 11/2001 | Bergman et al. | 438/706 |
| 6,333,275 B1 | 12/2001 | Mayer et al. | 438/745 |
| 6,405,101 B1 | 6/2002 | Johanson et al. | 700/218 |
| 6,427,359 B1 | 8/2002 | Scranton et al. | 34/444 |

Primary Examiner—Robert R. Koehler
(74) Attorney, Agent, or Firm—Moser, Patterson & Sheridan (57) ABSTRACT

A method for cleaning the electrical contact areas or substrate contact areas of an electrochemical plating contact ring is provided. Embodiments of the method include positioning a substrate on a substrate support member having one or more electrical contacts, chemically plating a metal layer on at least a portion of a surface of the substrate, removing the processed substrate from the support member, and cleaning the one or more electrical contacts with a vapor mixture comprising an alcohol. In another aspect, the method includes spraying the vapor mixture on the electrical contacts while rotating the substrate support member.

19 Claims, 3 Drawing Sheets

FIG. 1

FIG. 1